United States Patent
Furukawa et al.

[11] Patent Number: 6,100,172
[45] Date of Patent: Aug. 8, 2000

[54] METHOD FOR FORMING A HORIZONTAL SURFACE SPACER AND DEVICES FORMED THEREBY

[75] Inventors: Toshiharu Furukawa, Essex Junction; Mark C. Hakey; Steven J. Holmes, both of Milton; David V. Horak, Essex Junction; Paul A. Rabidoux, Winooski, all of Vt.

[73] Assignee: International Business Machines Corporation, Armonk, N.Y.

[21] Appl. No.: 09/182,173

[22] Filed: Oct. 29, 1998

[51] Int. Cl.[7] .................... H01L 21/22; H01L 21/8234; H01L 21/425

[52] U.S. Cl. .................... 438/561; 438/238; 438/524; 438/553; 438/526; 438/515; 438/513; 438/494; 438/498; 438/542; 438/561; 438/578

[58] Field of Search .................... 438/238, 524, 438/553, 526, 515, 513, 494, 498, 542, 561, 578

[56] References Cited

U.S. PATENT DOCUMENTS

| | | | |
|---|---|---|---|
| 4,280,854 | 7/1981 | Shibata et al. . | |
| 4,464,460 | 8/1984 | Hiraoka et al. | 430/323 |
| 4,523,963 | 6/1985 | Ohta et al. | 438/162 |
| 4,761,464 | 8/1988 | Zeigler . | |
| 4,891,303 | 1/1990 | Gaza et al. | 430/312 |
| 5,102,688 | 4/1992 | Hashimoto et al. | 427/552 |
| 5,185,294 | 2/1993 | Lam et al. . | |
| 5,198,520 | 3/1993 | Onishi et al. | 528/33 |
| 5,306,390 | 4/1994 | Peek | 438/524 |
| 5,554,568 | 9/1996 | Wen | 438/197 |
| 5,573,837 | 11/1996 | Roberts et al. | 428/210 |
| 5,776,764 | 7/1998 | Ueta et al. | 430/270.1 |
| 5,985,513 | 11/1999 | Kani et al. | 430/270.1 |

OTHER PUBLICATIONS

Timothy W. Weidman and Ajey M. Joshi, "New Photodefinable Glass Etch Masks For Entirely Dry Photolighogroahy: Plasma Deposited Organosilicon Hydride Polymers", Appl. Phys, Lett. 62(4), Jan. 25, 1993.

R.L. Kostelak, T.W. Weidman, and S. Vaidya, "Application of Plasma Polymerized Methylsilane Resist For All–Dry 193 nm Deep Ultraviolet Processing", J. Vac. Sci. Technol. B 13(6), Nov./Dec. 1995.

Primary Examiner—Brian Dutton
Assistant Examiner—Brook Kebede
Attorney, Agent, or Firm—Schmeiser, Olsen & Watts; Eugene I. Shkurko

[57] ABSTRACT

The present invention provides a method for forming self-aligned spacers on the horizontal surfaces while removing spacer material from the vertical surfaces. The preferred method uses a resist that can be made insoluble to developer by the use of an implant. By conformally depositing the resist over a substrate having both vertical and horizontal surfaces, implanting the resist, and developing the resist, the resist is removed from the vertical surfaces while remaining on the horizontal surfaces. Thus, a self-aligned spacer is formed on the horizontal surfaces while the spacer material is removed from the vertical surfaces. This horizontal-surface spacer can then be used in further fabrication. The preferred method can be used in many different processes where there is exists a need to differentially process the vertical and horizontal surfaces of a substrate.

19 Claims, 8 Drawing Sheets

METHOD FOR FORMING A HORIZONTAL SURFACE SPACER AND DEVICES FORMED THEREBY

BACKGROUND OF THE INVENTION

1. Technical Field

The present invention relates generally to the field of semiconductor manufacturing and, more specifically, to a method for forming spacers on horizontal surfaces.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

One of the bedrock technologies in semiconductor fabrication is the use of sidewall spacers. Typical sidewall spacers are formed using a conformal deposition of a spacer material over a structure, followed by a directional etch, as disclosed in Pogge, U.S. Pat. No. 4,256,514, "Method for Forming a Narrow Dimensioned Region on a Body," assigned to International Business Machines, Inc. The directional etch removes all the spacer material from the horizontal surfaces, but leaves "spacers" on the vertical surfaces of the structure. To form sidewall spacers material is conformally deposited over the structure, covering the horizontal and vertical surfaces. A directional etch is then preformed. This directional etch removes the material from the horizontal surfaces, while leaving the material on the sidewalls to form sidewall spacers. These spacers are inherently self-aligned with the sidewalls. These sidewall spacers can be used in a wide variety of applications for a wide variety of reasons For example, the use of sidewall spacers has been particular useful in the formation of field effect transistors (FETs). In this application sidewall spacers are formed on the sidewalls of transistor gates, where they are used to protect the gates and allow for improved dopant control at the gate edges.

Unfortunately, the sidewall spacers has several limitations. The most significant limitation is that sidewall spacers, as their name implies, can only be formed on the vertical surfaces or sidewalls of the structure. There is no corresponding simple way to form an inherently self aligned spacer on the horizontal surface while removing all the spacer material from the vertical surfaces. Such a horizontal surface spacer could be used in a wide variety of applications, such as whenever selective processing needs to be done to the vertical surfaces while the horizontal surfaces remain protected.

Thus, there is exists a need for a self-aligned spacer design that covers horizontal surfaces while being removed from vertical surfaces.

DISCLOSURE OF INVENTION

Accordingly, the present invention provides a method for forming self-aligned spacers on the horizontal surfaces while removing spacer material from the vertical surfaces. The preferred method uses a resist that can be made insoluble to developer by the use of an implant. By conformally depositing the resist over a substrate having both vertical and horizontal surfaces, implanting the resist, and developing the resist, the resist is removed from the vertical surfaces while remaining on the horizontal surfaces. Thus, a self-aligned spacer is formed on the horizontal surfaces while the spacer material is removed from the vertical surfaces. This horizontal-surface spacer can then be used in further fabrication. The preferred method can be used in many different processes where there exists a need to differentially process the vertical and horizontal surfaces of a substrate.

The preferred method of forming a horizontal-surface spacer does so without requiring excessive processing complexity. The preferred method of forming a horizontal surface spacer can be used in many different processes where there exists a need to differentially process the vertical and horizontal surfaces of a substrate.

In one application of preferred method the conformal resist includes a dopant species, such as arsenic. After the horizontal-surface spacers are formed, the substrate is annealed, causing the dopant to diffuse into the adjacent horizontal surfaces. This can be used to form conductive lines, such as bitlines, at selective horizontal surfaces.

The foregoing and other advantages and features of the invention will be apparent from the following more particular description of a preferred embodiment of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements.

BEST MODE FOR CARRYING OUT THE INVENTION

The preferred embodiment of the present invention provides a method for forming self-aligned spacers on the horizontal surfaces while removing the spacer material from the vertical surfaces. The preferred method uses a resist that can be made insoluble to developer by the use of an implant. By conformally depositing the resist over a substrate having both vertical and horizontal surfaces, implanting the resist, and developing the resist, the resist is removed from the vertical surfaces while remaining on the horizontal surfaces. Thus, a self-aligned spacer is formed on the horizontal surfaces while the spacer material is removed from the vertical surfaces. This horizontal-surface spacer can then be used in further fabrication. A general method for forming horizontal-surface spacers will first be described, followed by a description of a buried conductor line formed with the preferred method.

Figure 1:
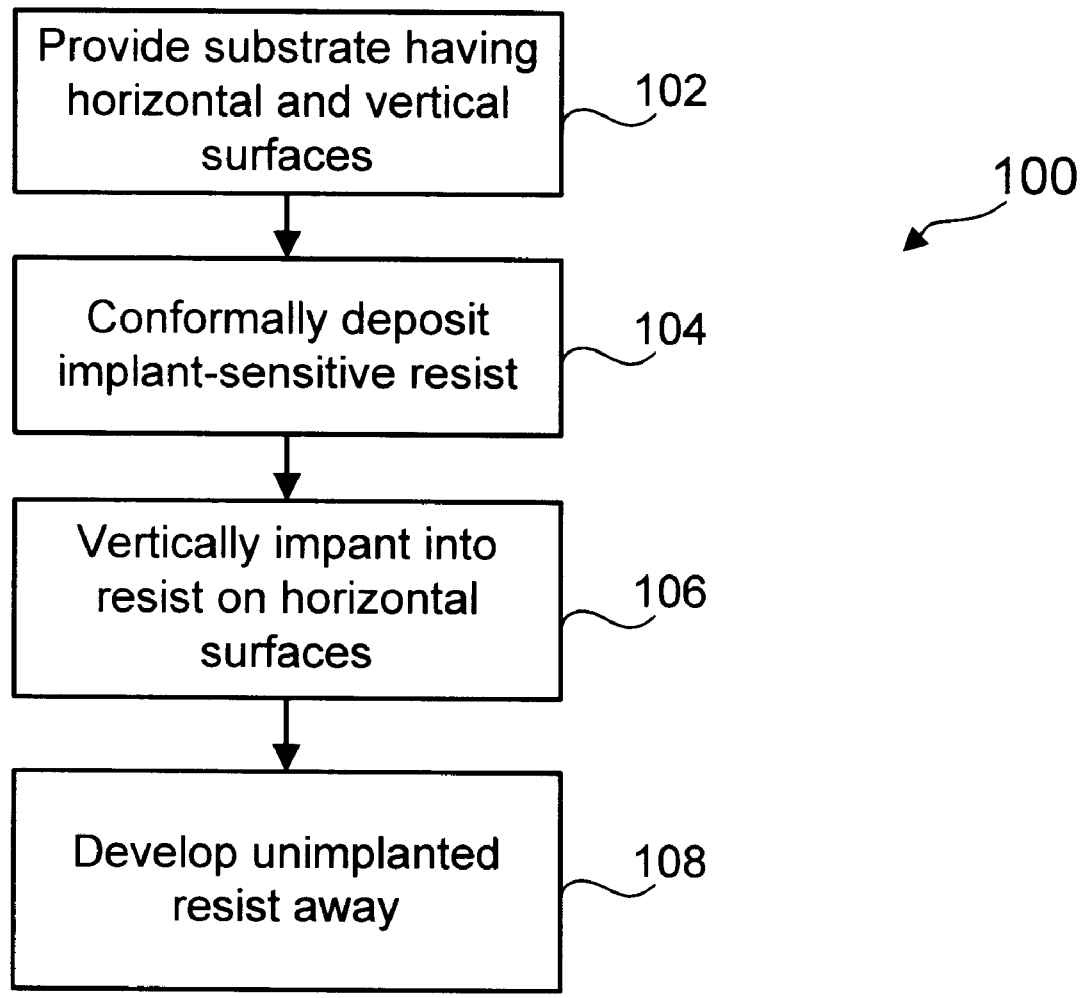
FIG. 1 is a flow diagram illustrating a preferred method for forming horizontal-surface spacers.

Turning now to FIG. 1, a method 100 for forming horizontal-surface spacers in accordance with the preferred embodiment is illustrated. The method can be used in a wide variety of applications where it is desirable to differentially process the vertical and horizontal surfaces of a device.

The first step 102 is to provide a suitable substrate having horizontal and vertical surfaces. Such a substrate can suitably comprise silicon or other semiconductor wafers in various stages of fabrication. For example, the substrate can comprise a silicon wafer on which a plurality of devices are to be connected using a buried conductor layer. The substrate thus includes both vertical surfaces, which are to remain uncovered, and horizontal surfaces, on which the horizontal-surface spacers are to be formed. The substrate can include an etch stop layer such as silicon oxide for use as a develop stop when the resist is developed.

Figure 2:
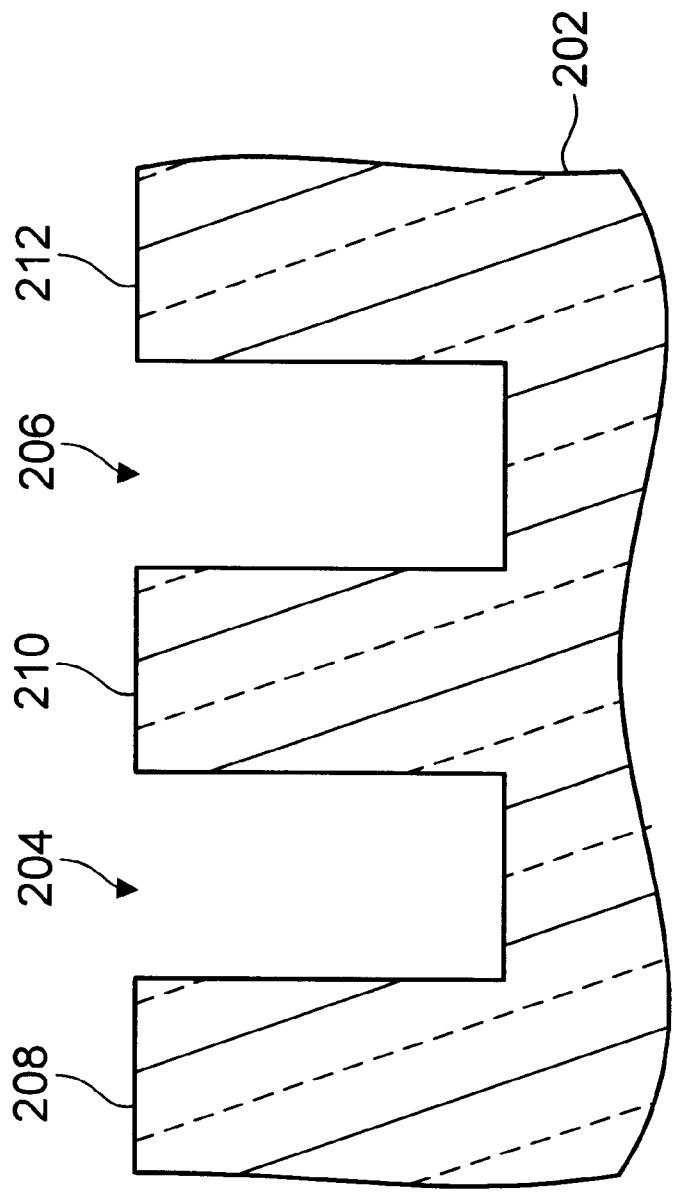
FIGS. 2–5 are cross sectional side views of wafer portions during processing in accordance with the preferred embodiment of the present invention.

Turning now to FIG. 2, a cross section of a wafer portion 202 is illustrated in which two exemplary trenches 204 and 206 have been etched, forming pillars 208 210 and 212. These features are exemplary of the types of features that can be selectively covered with horizontal-surface spacers in accordance with the preferred embodiment. The trenches and pillars of the illustrated structure can be formed using any suitable method, such as conventional photolithograpic techniques.

Returning to FIG. 1, the next step 104 is to conformally deposit a suitable implant-sensitive resist. Preferably, the resist is formulated such that implanted areas become insoluble in developer, while unimplanted areas remain soluble in developer. Also, the resist is preferably made thin to minimize the amount of energy needed to pattern the resist.

One example of a suitable resist is a polysilane resist that is deposited from a plasma formed with methylsilane. This resist has several unique properties. First, it can be developed as both positive and negative tone resist. Second, the resist can be conformally deposited using methylsilane in a chemical vapor deposition (CVD) process. Third, it can be activated both by two types of exposures, an oxygen ion implantation or by irradiation with UV light in the presence of oxygen. During either type of exposure, the silicon-silicon bonds are cleaved, and oxygen reacts with the activated silicon atoms. Silicon dioxide is formed in the exposed areas as a result of this reaction, while the unexposed areas remain as polysilane. The develop process utilizes chemistry, either in solution, vapor, or plasma form, that selectively removes either silicon (to make a negative tone image) or silicon dioxide (to make a positive tone image). In order to enhance the formation of silicon-silicon bonds during the deposition, low plasma powers and low temperatures are used. Silicon-carbon bonds are generally not cleaved upon exposure, and degrade the resist response. A process for the deposition and development of these resist films has been commercialized by Applied Materials, Inc., of Santa Clara, Calif. A general description of the process is available in the literature, e.g., R. L. Kostelak, T. W. Weidman, S. Vaidya, O. Joubert, S. C. Palmateer, M. Hibbs, J. Vac. Sci. Tech. R, vol 13,1995, p2994–2999, T. W. Weidman, A. M. Joshi Appl. Phys. Lett. vol 62,1993, p372–374.

In the preferred embodiment of the present invention the polysilane resist is used in its negative tone manner. In particular, the resist is implanted with oxygen ions, and then developed with a chlorine or bromine developer that removes only those portions of resist that were not implanted with oxygen. Furthermore, in one embodiment the resist is doped and used to diffuse dopant into adjacent portions of the substrate. This feature will be described in more detail later with reference to the buried conductor application.

Another material that can be used as an implant sensitive resist is polysilicon. Polysilicon can be conformally deposited using any conventional technique. Polysilicon can be made insoluble in potassium hydroxide/isopropyl alcohol developer with a suitable boron implant, while unimplanted areas remain soluble to that developer.

Figure 3:
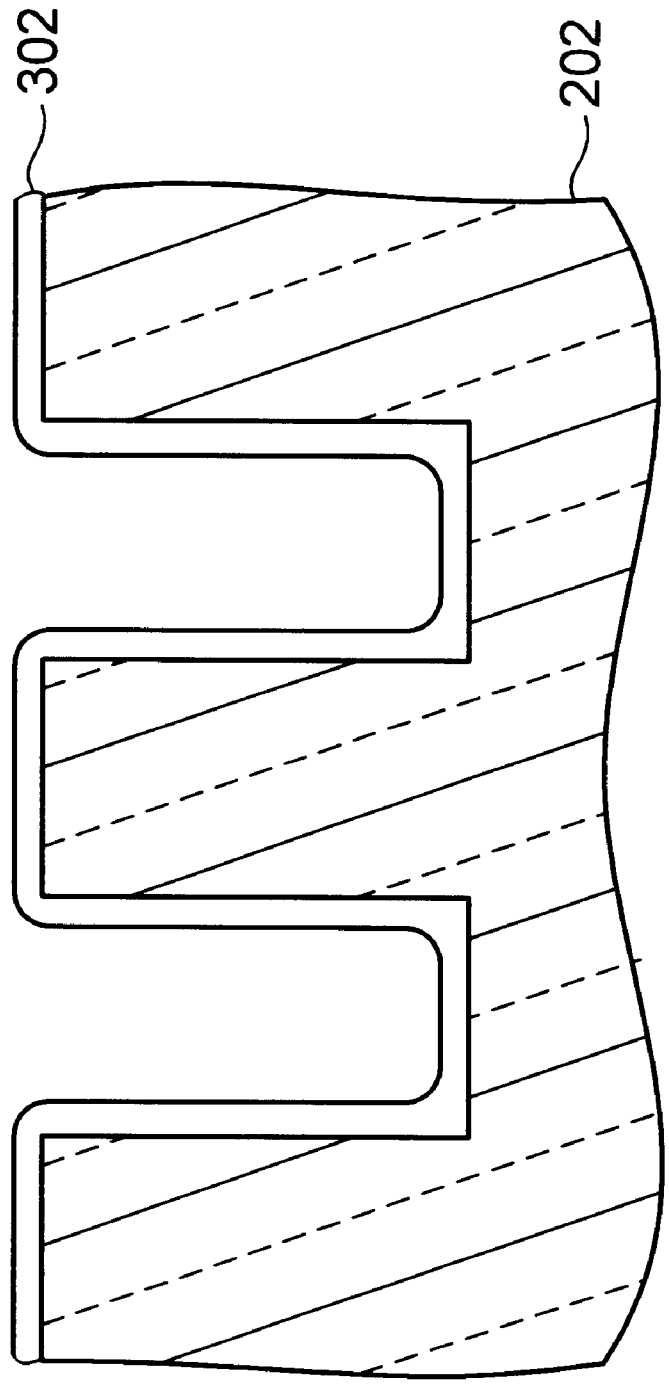

Turning now to FIG. 3, the exemplary wafer portion 202 is illustrated after a conformal resist layer 302 has been deposited to cover the wafer portion. In accordance with the preferred embodiments, the conformal resist layer 302 covers both the horizontal and vertical surfaces in the wafer portion.

The next step 106 is to vertically implant into the horizontal surfaces of the resist layer with a species that makes the resist layer insoluble in developer. The type of implant performed would thus depend on the resist used. The energy of the implant is preferably selected to fully implant into the resist on the horizontal surfaces while not implanting too far into the vertical surfaces. The implant is preferably done at a perpendicular angle to the top surface of the wafer such that implanting in the vertical surfaces is minimized.

For example, when using the preferred silane resist, an oxygen ion implant is preferably made perpendicular with the horizontal surfaces on the substrate. For the preferred resist, this exposure will cause the horizontal surfaces of the resist to become insoluble in developer solutions. The oxygen implant is preferably performed using a ion implant tool that creates charged ions of oxygen uses an electric or magnetic field to accelerate the charged ions toward the surface of wafer. This causes the oxygen to be implanted into resist. This implantation process differs from conventional processes where the resist is exposed to actinic radiation (e.g, light) in the presence of oxygen ambient.

When using a polysilicon resist, boron is preferably implanted to make the polysilicon on the horizontal surfaces insoluble in developer. This implant is referably performed using a ion implant tool that accelerates boron towards the surface of the wafer, causing it to be implanted into the polysilicon resist. Typically a $BF_2$ implant of $1 \times 10^{15}$–$1 \times 10^{18}$ ions/cm$^3$ at 10 KeV is preferable to make the polysilicon resist insoluble in developer.

Figure 4:
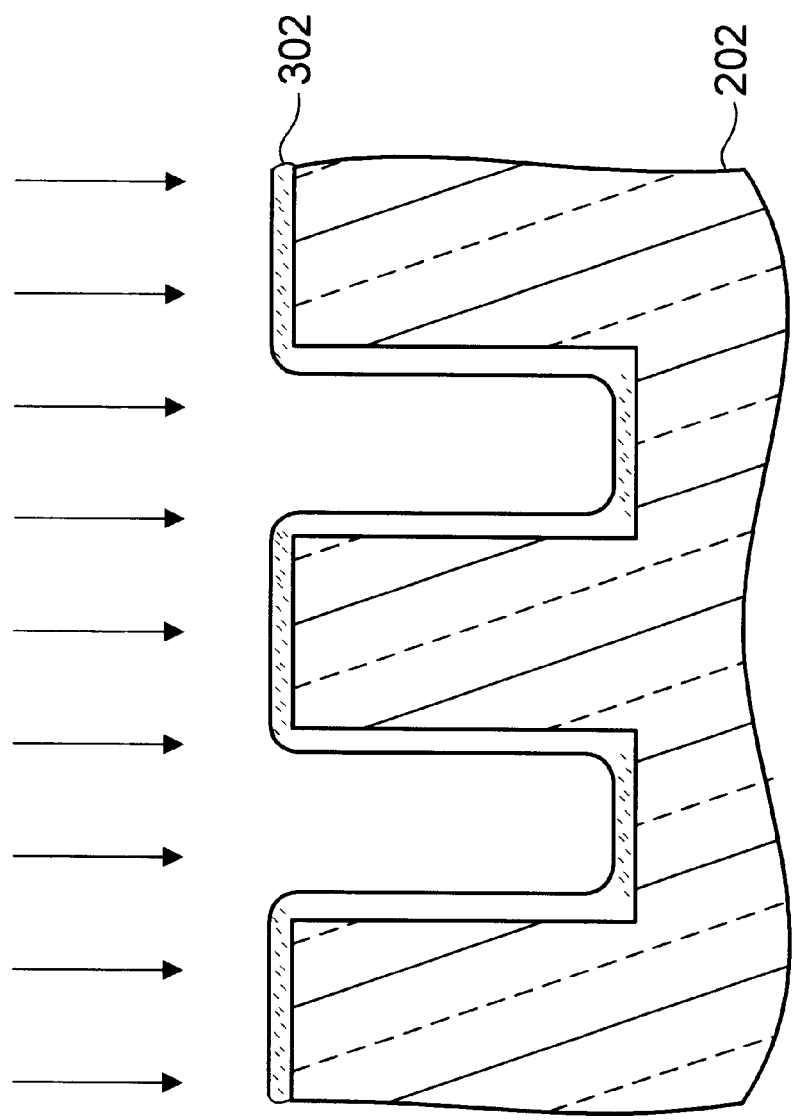

Turning now to FIG. 4, the exemplary wafer portion 202 is illustrated showing a perpendicular implant into resist 302. Because the implant is made perpendicular to the horizontal surfaces, those surfaces can be fully implanted from top to bottom, while the vertical surfaces of the resist are not affected. Again, this is facilitated by selecting an implant energy that implants through substantially the full thickness of the resist, without having enough energy to implant fully down the vertical portions of the resist. In this way, the horizontal surfaces become insoluble in developer while the vertical surfaces are substantially unaffected. Additionally, the dose of implant is preferably selected to fully react the resist formulation used. Thus, the energy and dose of the implant are preferably selected to fully react with the horizontal surfaces, while minimizing impact to the vertical surfaces.

Returning to FIG. 1, the next step 112 is to develop the resist. This can be done using any suitable etchant that is compatible with the resist used. For example, when a silane resist is used, a plasma chlorine etch will remove unimplanted portions of the resist without effecting the oxygen implanted portions. Other resist formulations may use other development techniques.

Figure 5:
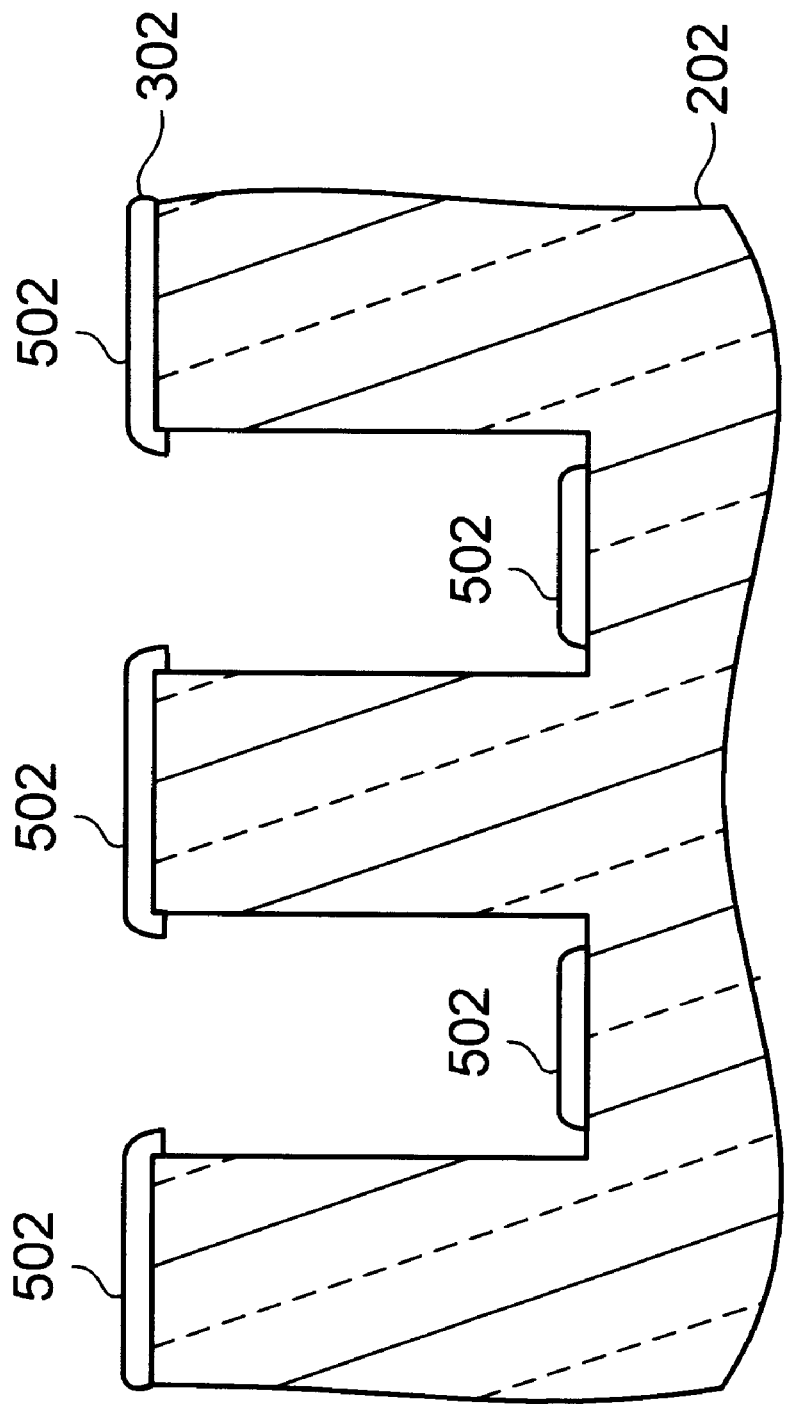

Turning now to FIG. 5, the exemplary wafer portion 202 is illustrated after unimplanted portions of resist 302 have been removed, while the implanted portions of resist 302 remain. The remaining portions of resist now comprise horizontal-surface spacers 502 that can be used to facilitate differential processing of the vertical surfaces relative to the horizontal surfaces. It should be noted that this process typically leaves a small portion of resist 302 overhanging the edges of the trenches. The amount of overhang can be controlled by selecting the thickness of the resist.

Thus, the preferred embodiment can be used to form horizontal-surface spacers which can be used in a wide variety of processing situations. For example, the preferred method can be used in the formation of a buried conductor line. Buried conductor lines are used to interconnect devices, such as transistors, without requiring the use of separate conductive wiring as is typically the case. One example where a buried conductor is desirable is in a pillar Dynamic Random Access Memory (DRAM). In particular, the buried conductor can be used to form the bitline that connects the various memory cells in the DRAM. It should be noted that while the preferred embodiment is described with reference bitlines in DRAM devices, it is also applicable to the formation of other types of memory devices such as the DRAM variations (Extended Data Out DRAM, Burst Extended Data Output DRAM, Synchronous DRAM, etc) and Static Random Access Memory (SRAM) and its variations (Asynchronous SRAM, Synchronous SRAM, Pipelined Burst SRAM, etc.).

To form such a buried bitline several variations of the preferred method are used. First, a diffusion barrier layer such as silicon dioxide or silicon nitride is formed at the top of the pillars. This can be done by forming the diffusion barrier layer before the pillars are etched. When the trenches defining the pillars are etched, the diffusion barrier layer remains at the top the formed pillars. Second, the conformally deposited resist is doped to include suitable dopant species for forming the buried bitlines. For example, the preferred silane resist can be doped with arsenic during deposition. After the suitably doped implant-sensitive resist has been conformally deposited, it can patterned using the implant technique described above, and developed. This results in the doped resist being left on the horizontal surfaces, while being removed from the vertical surfaces. The wafer is then suitably annealed, causing the dopant to diffuse from the doped resist and into the vertical surfaces of the substrate. At the bottoms of the pillars, the dopant diffusion forms conductive bitlines in the substrate. At the tops of the pillars the dopant diffuses into the diffusion barrier layer and thus does not substantially effect the underlying silicon. In an variation on this application, a separate dopant source layer is formed before the resist is deposited, with the dopant source layer being patterned with the resist layer. This variation may be preferable when a higher dopant dose is desirable.

After the diffusions are formed the remaining resist is stripped. The diffusions can be divided into separate diffusions for use as separate conductors (e.g., separate bitlines) on each side by further etching the bottom of the trench using a suitable processes such as reactive ion etching.

Figure 6:
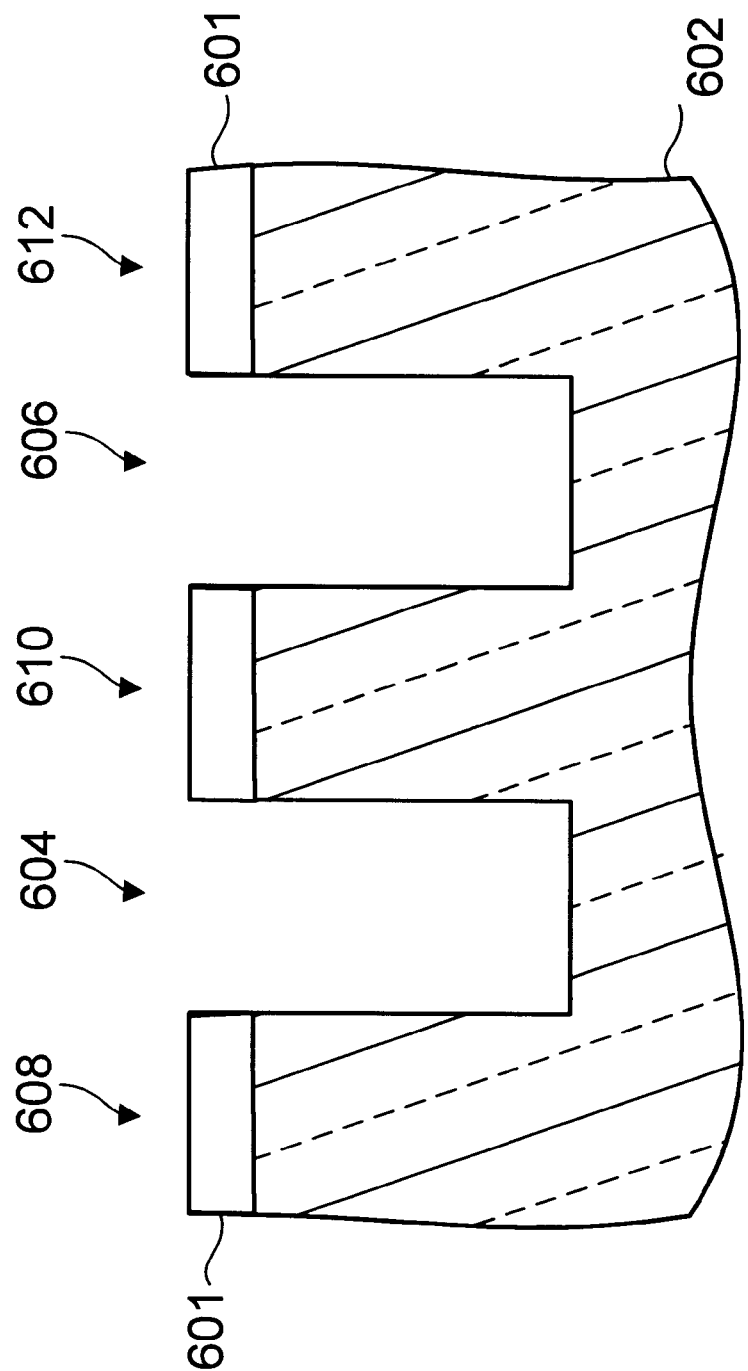
FIGS. 6–7 are cross sectional side view of wafer portion during formation of buried bitlines in accordance with the preferred embodiments.
Figure 7:
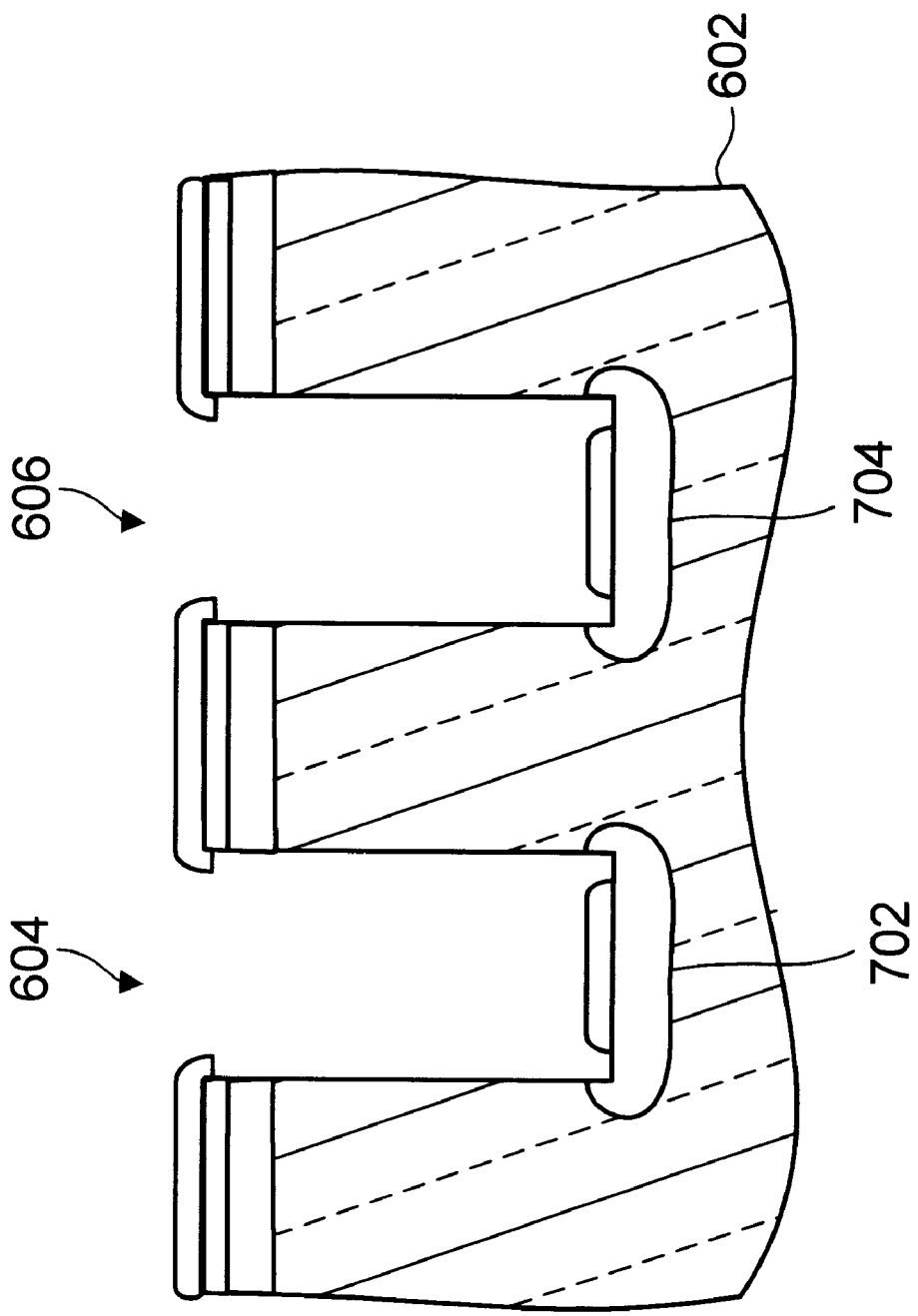

Turning now to FIG. 6, a wafer portion 602 is illustrated on which a suitable diffusion barrier layer 601 has been deposited and that has been patterned and etched to form two exemplary trenches 604 and 606 and pillars 608, 610 and 612. Turning now to FIG. 7, the wafer portion 602 is illustrated after a suitably doped, implant-sensitive resist has been deposited, implanted, and developed, and after dopant from the remaining resist has been diffused into the wafer portion 602. The trench was then further etched to divide the diffusions into separate conductive lines. Again, the dopant diffuses from the patterned resist at the bottoms of trenches 604 and 606, where it forms conductive bitlines 702 and 704. Likewise, the dopant diffuses into the diffusion barrier layer 601 at the top of the pillars, where it is prevented from diffusing into the silicon substrate.

After the dopant has been diffused into the substrate, the remaining resist can be stripped using a reactive ion etch, BHF, HF vapor, or other suitable process.

As another example, the preferred method can be used to facilitate selective doping of the vertical surfaces by exposing a wafer with horizontal surface spacers to a gaseous dope source. Such a process could be used to form a high performance logic MOSFET. This would involve making a silicon substrate with appropriate isolation regions and doped N+ and P+ diffusions for source and drain contacts. An etch stop film, comprising a suitable material such as silicon nitride would be deposited, and the wafer patterned to form trenches. Horizontal surface spacers are then formed using the preferred method. With the spacer material formed on the horizontal surfaces and removed from the vertical surfaces, the exposed sidewalls are doped with a suitable dopant. This can be done using a suitable gaseous dopant (e.g., $AsH_3$ arsine vapor for N+ regions, and $B_2H_6$, diborane, for P+ regions) or depositing a dopant source layer (e.g., ASG or BSG doped oxide) followed by an anneal. The horizontal surface spacers protect the horizontal surfaces during this procedure. The sidewall doping connects the doped surface areas to the transfer gate, ensuring that the diffusion overlaps the gate channel region at the bottom of the trench.

Figure 8:
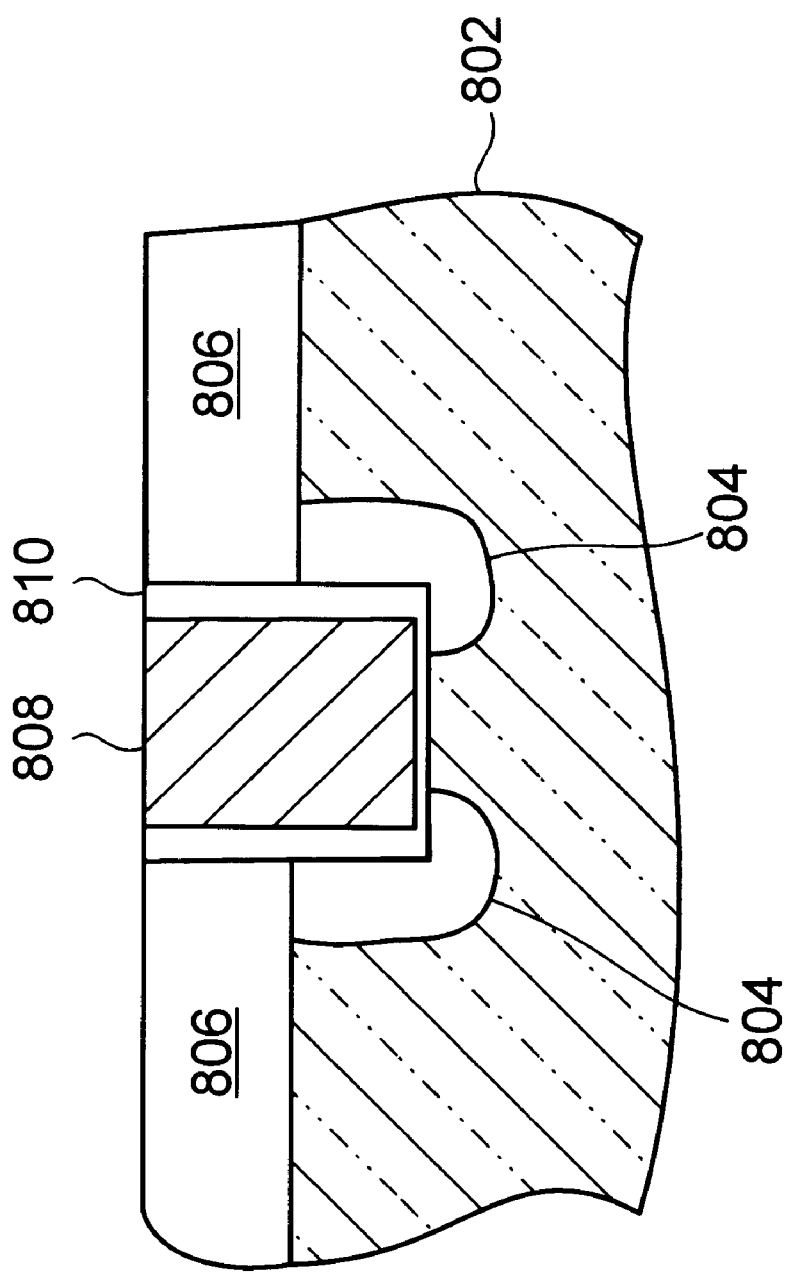
FIG. 8 is a cross sectional side view of a wafer portion after formation of a high performance MOSFET in accordance with the preferred embodiment.

With the sidewalls doped, the remaining resist is stripped using a buffered HF, HF vapor, or fluorine plasma process and the wafer is cleaned. Gate dielectric is then formed in the trench. This is preferably done by growing silicon dioxide in the trench. The sidewall dopant and crystal orientation of silicon will cause the silicon dioxide to be thicker on the vertical sidewalls. The trench is then filled with polysilicon and polished to planarize. Contacts and wiring can then proceed using any suitable technique. Turning now to FIG. 8, an exemplary wafer portion 802 is illustrated in which a logic MOSFET has been formed using the preferred method to selectively form diffusions 804 on the sidewalls of the trench. The logic device includes a polysilicon gate 808 and a gate dielectric 810. Diffusions 804 combine with diffusions 806 to form the sources and drains of the device. Again, by using the preferred method to selectively dope the sidewalls ensuring that the diffusion overlaps the gate channel region at the bottom of the trench.

Conventional processes would use sidewall spacers to selectively dope the sidewalls. Unfortunately, the reactive ion etching used to directionally etch the sidewall spacers typically damages the bottom of the trench. In contrast, by using the preferred method of forming horizontal surface spacers facilitate differential doping of the sidewalls, the required diffusion regions can be formed without the damaging reactive ion etching.

Thus, the preferred embodiment has been used to form self-aligned spacers on the horizontal surfaces while removing the spacer material from the vertical surfaces. This horizontal-surface spacer can then be used in further fabrication, including in the formation of buried conductor lines and sidewall diffusion regions.

While the invention has been particularly shown and described with reference to an exemplary embodiment to form bitline diffusions in pillar DRAM cells, those skilled in the art will recognized that the process can be used to form source/drain and other diffusion structures For example, it will also be understood by those skilled in the art that the invention is applicable to different isolation technologies (e.g., LOCOS, recessed oxide (ROX), STI, etc.), well and substrate technologies, dopant types, energies and species. It will also be understood that the spirit of the invention is applicable to other silicon-based technologies (e.g., BiCMOS, bipolar, silicon on insulator (SOI), silicon germanium (SiGe).

What is claimed is:

1. A method for forming a horizontal-surface spacer on a semiconductor substrate having horizontal surfaces and vertical surfaces, the method comprising the steps of:
   a) conformally forming an implant sensitive resist layer on the horizontal surfaces and the vertical surfaces;
   b) implanting into said implant sensitive resist layer substantially perpendicular to said horizontal surfaces such that the implant sensitive resist layer on the horizontal surfaces is substantially implanted and the implant sensitive resist layer on the vertical surfaces is substantially unimplanted; and
   c) developing the implant sensitive resist layer such that the substantially unimplanted resist layer is removed from the vertical surfaces and the substantially implanted resist layer remains on the horizontal surfaces.

2. The method of claim 1 wherein the step of conformally forming implant sensitive resist layer comprises chemical vapor deposition of the implant sensitive resist layer.

3. The method of claim 1 wherein the implant sensitive resist layer comprises polysilane.

4. The method of claim 1 wherein the step of conformally forming implant sensitive resist layer comprises chemical vapor deposition of polysilane resist layer from a plasma formed with methylsilane.

5. The method of claim 1 wherein the step of implanting into said implant sensitive resist layer comprises implanting oxygen.

6. The method of claim 1 wherein the step of implanting into said implant sensitive resist layer comprises implanting nitrogen.

7. The method of claim 1 wherein the step of implanting into said implant sensitive resist layer comprises accelerating an implant species through a field to drive the implant species into the implant sensitive resist layer.

8. The method of claim 1 wherein the step of developing the implant sensitive resist layer comprises developing with a chlorine plasma.

9. The method of claim 1 further comprising the step of doping said implant sensitive resist layer with a dopant species before implanting said implant sensitive resist.

10. The method of claim 9 wherein the step said dopant species comprises arsenic.

11. The method of claim 9 further comprising the step of diffusing said dopant specifies from said implant sensitive resist layer and into said horizontal surfaces of said substrate after said implant sensitive resist layer has been removed from said vertical surfaces.

12. The method of claim 11 wherein the step of diffusing said dopant species forms a buried conductor.

13. The method of claim 12 wherein the buried conductor comprises a buried bitline in a memory cell.

14. The method of claim 1 further comprises the step of diffusing dopant into the exposed vertical surfaces to form source/drain diffusion regions.

15. The method of claim 1 further comprises the step of diffusing dopant into the exposed vertical surfaces to form diffusions in a logic device.

16. The method of claim 1 wherein the implant sensitive resist layer comprises polysilicon.

17. The method of claim 16 wherein the step of implanting comprises implanting boron.

18. The method of claim 17 wherein the step of developing the implant sensitive resist layer comprises developing with KOH/Isopropyl alcohol.

19. A method for forming a horizontal-surface spacer on a semiconductor substrate having horizontal surfaces and vertical surfaces, the method comprising the steps of:
   a) conformally forming an implant sensitive resist layer on the horizontal surfaces and the vertical surfaces by chemical vapor deposition of polysilane from a plasma formed with methylsilane;
   b) implanting oxygen into said implant sensitive resist layer substantially perpendicular to said horizontal surfaces such that implant sensitive resist layer on the horizontal surfaces is substantially implanted and the implant sensitive resist layer on the vertical surfaces is substantially unimplanted; and
   c) developing the implant sensitive resist layer with a chlorine plasma such that the substantially unimplanted resist layer is removed from the vertical surfaces and the substantially implanted resist layer remains on the horizontal surfaces.

* * * * *